(12) United States Patent
Kobayashi

(10) Patent No.: US 6,523,143 B1
(45) Date of Patent: Feb. 18, 2003

(54) MEMORY TESTING APPARATUS

(75) Inventor: Shinichi Kobayashi, Tokyo (JP)

(73) Assignee: Advantest Corporation, Tokyo (JP)

( * ) Notice: Subject to any disclaimer, the term of this patent is extended or adjusted under 35 U.S.C. 154(b) by 384 days.

(21) Appl. No.: 09/612,600

(22) Filed: Jul. 7, 2000

(30) Foreign Application Priority Data

Jul. 7, 1999 (JP) .......................................... 11-192627

(51) Int. Cl.$^7$ .......................... G06F 11/00; G11C 29/00
(52) U.S. Cl. ........................ 714/718; 714/738; 365/201
(58) Field of Search ................................ 714/723, 718, 714/719, 735, 736, 738, 742, 710, 711, 819, 824, 42, 5, 6, 7, 8; 365/200, 201, 230.01; 711/200, 202, 209, 221

(56) References Cited

U.S. PATENT DOCUMENTS

| | | | | |
|---|---|---|---|---|
| 5,408,628 A | * | 4/1995 | Ameti .......................... | 714/25 |
| 5,457,791 A | * | 10/1995 | Matsumoto et al. ........... | 714/5 |
| 6,031,758 A | * | 2/2000 | Katayama et al. ..... | 365/185.09 |
| 6,081,463 A | * | 6/2000 | Shaffer et al. ............... | 365/200 |
| 6,360,341 B1 | * | 3/2002 | Yoshinaga ................... | 714/718 |

* cited by examiner

*Primary Examiner*—Christine T. Tu
(74) *Attorney, Agent, or Firm*—Rosenthal & Osha L.L.P.

(57) ABSTRACT

Memory testing apparatus capable of reducing time necessary for transmitting an address signal from a pattern generator to a failure analysis memory. The memory testing apparatus includes: a pattern generator which outputs an input address signal, an input test signal (including an input data signal) and an expectation value data signal; a signal input-output unit; a comparator which compares the output data signal with the expectation value data and outputs a defect-indicating data; a defective data storing memory; and a failure history storing memory, wherein the pattern generator includes: a sequence control unit which generates a sequence control signal that controls an address generator, a data generator and a control signal generator connected thereto, where the address generator outputs a first address signal and a second address signal therefrom, and the address generator is connected, via two separate transmission lines, respectively to the defective data storing memory and the failure history storing memory. Thereby, the first address signal and the second address signal can be independently and separately supplied to the defective data storing unit and the failure history storing memory, respectively.

11 Claims, 6 Drawing Sheets

MEMORY TESTING APPARATUS

This patent application claims priority based on a Japanese patent application, H11-192627 filed on Jul. 7, 1999, the contents of which are incorporated herein by reference.

BACKGROUND OF THE INVENTION

1. Field of the Invention

The present invention relates to a memory testing apparatus for testing memory devices, and it particularly relates to the memory testing device capable of performing failure analysis on the memory devices.

2. Description of the Related Art

In recent years, high integration of the memory devices has been significant due to developments in semiconductor manufacturing processes. Thus, there are many occasions where large-scale newly developed memory needs to be tested. Evaluating a whole memory devices as a failure as a result of a single failure cell (defective spot) in the memory device is not ideal in terms of productivity or yield.

Thus, there is available a method in which the memory device is equipped with a redundant structure in advance, so that a failure cell can be saved by replacing the failure cell with a spare memory. In this method, a memory device which is non-defective as a whole can be produced even though part of cell is defective, so that the yield can be improved. Moreover, a defective spot can be scrutinized so as to perform the failure analysis for finding and mending a cause of the failure, thus being desirable in the course of improving the yield of the devices.

FIG. 1 shows how a pattern generator 10 is connected to a failure memory 20 in the conventional memory testing apparatus, which tests a memory under test. The pattern generator 10 includes a sequence control unit 12; an address generator 14; a data generator 16; and a control signal generator 18. The address generator 14 includes: an internal address generator 26; an address converting unit 28; and selectors 30a and 30b. Moreover, the failure analysis memory 20 includes: a defective data storing memory 22; and a failure history storing memory 24. The defective data storing memory has the same capacity as that of the memory device under test.

The sequence control unit 12 generates a sequence signal 32 that controls the sequence of the address generator 14, data generator 16 and control signal generator 18. In the address generator 14, the internal address generator 26 generates an internal address corresponding to the cell configuration of the memory under test, based on the sequence control signal 32. Here, the memory cell of the memory device is configured in the optimum position, so that an address to be input to the address pin of the memory device is not necessarily matched up with the internal address within the cell. This is because the wiring, which connects the address pin to each cell, is formed by a request concerning the physical configuration and arrangement. Thus, the address converting unit 28 converts the internal address to an input address which specifies the cell of the memory under test that the internal address primarily addresses, from the address pin of the memory under test. The internal address corresponds to the input address in a one-to-one manner. The selector 30a selects the input address and outputs the input address signal 34 to the memory under test. The input address signal 34 that is input to the memory under test accesses a memory cell specified by the corresponding internal address.

When a defective spot is found in the memory under test as a result of the test, the pattern generator 10 supplies to the failure analysis memory 20 the data on defective saving and/or failure analysis. The selector 30b supplies an address signal 36 which corresponds to the address of the defective spot of the memory under test, to the address pin of the defective data storing memory 22 and the data pin of the failure history storing memory 24. The address signal 37 is either the internal address signal corresponding to the internal cell of the memory under test, or the input address in which the internal address signal is converted based on the physical configuration and arrangement of the internal cell of the memory under test and the address pins. Moreover, the data generator 16 supplies to the data pin of the failure history storing memory 24, a data signal 38 acquired at the time the detective spot was detected. At the same time, the control signal generator 18 supplies to the data pin of the failure history storing memory 24, a control signal 40 acquired at the time of detection of the defective spot. The defective data is supplied to the data pin of the failure data storing memory 22 while an increment signal is supplied to the address pin of the failure history storing memory 24.

As a result thereof, in the defective data storing memory 22, the defective data is written to an address corresponding to an address cell of the defective cell of the memory under test. Moreover, in the failure history storing memory 24, the failure history data such as data and address at the time of testing are written thereto in the order that the failures were detected. Data stored in the defective data storing memory 22 and the failure history storing memory 24 will be utilized in saving the defective cells as well as in failure analysis at a later stage.

Since in the conventional memory testing apparatus there exists only a single signal transmission line system between the pattern generator 10 and each of the defective data storing memory 22 and the failure history storing memory 24, the pattern generator 10 can only supply either the internal address or the input address signal to the defective data storing memory 22 and the failure history storing memory 24.

Thus, in the event that there is a request for supplying the internal address to the defective data storing memory 22 and for supplying the input address signal to the failure history storing memory 24, two steps of operations must be taken in the conventional memory testing apparatus. Namely, in satisfying this request, first the internal address signal indicating the defective address is stored in the defective data storing memory 22, and it is further required that, next, a program for the test is changed, so that the input address corresponding to the defective address is supplied to the failure history storing memory 24.

In that case, the test must be carried out at least twice, in order to store the data for use in the failure analysis, to the failure analysis memory 20. There is a problem in that development cost increases and hence a device will cost more, if it takes a longer time to perform the failure analysis. In this manner, it remains an important subject matter in the conventional practice, that data transmission time from the pattern generator 10 to the failure analysis memory 20 shall be shortened as much as possible.

SUMMARY OF THE INVENTION

Therefore, it is an object of the present invention to provide a memory testing apparatus which overcomes the above issues in the related art. This object is achieved by combinations described in the independent claims. The dependent claims define further advantageous and exemplary combinations of the present invention.

According to an aspect of the present invention, a memory testing apparatus for testing a memory, comprises: a pattern generator which outputs: an input address signal supplied to an address pin of the memory, an input test signal, including an input data signal, supplied to a data pin of the memory, and an expectation value data signal which is an expectation value data signal that is to be output, based on the input test signal, from the memory, as a response result from a normal memory device; a signal input-output unit which supplies the input test signal to the memory and receives an output data signal from the memory; a comparator which compares the output data signal with the expectation value data and outputs a defect-indicating data indicative of existence of a defective spot in the memory; a defective data storing memory which writes the defect-indicating data output from the comparator, to an address corresponding to the defective spot of the memory; and a failure history storing memory which stores failure history data including the input data signal when the defective spot is detected, wherein the pattern generator includes: an internal address generator which generates an internal address signal specifying an address based on a cell configuration inside the memory; an address converting unit which, based on a correspondence relationship between the cell configuration inside the memory and a pin configuration of the address pin, converts the internal address to the input address signal that is to be input to the address pin; a first address output unit which outputs to the defective data storing memory either the internal address signal or the input address signal; and a second address output unit which outputs to the failure history storing memory either the internal address signal or the input address signal.

The second address output unit outputs to the failure history storing memory either the internal address signal or the input address signal in a manner corresponding to the input data signal.

Preferably, the internal address signal represents a logical address and the input address signal represents a physical address.

Moreover, an input of the second address output unit may be connected to the first address output unit.

According to different aspect of the present invention, a memory testing apparatus for testing a memory, comprises: a pattern generator which outputs: an input address signal supplied to an address pin of the memory, an input test signal, including an input data signal, supplied to a data pin of the memory, and an expectation value data signal which is an expectation value data signal that is to be output, based on the input test signal, from the memory, as a response result from a normal memory device; a signal input-output unit which supplies the input test signal to the memory and receives an output data signal from the memory; a comparator which compares the output data signal with the expectation value data and outputs a defect-indicating data indicative of existence of a defective spot in the memory; a defective data storing memory which writes the defect-indicating data output from the comparator, to an address corresponding to the defective spot of the memory; and a failure history storing memory which stores failure history data including the input data signal when the defective spot is detected, wherein the pattern generator includes: a sequence control unit which generates a sequence control signal that controls an address generator, a data generator and a control signal generator connected thereto, where the address generator outputs a first address signal and a second address signal therefrom, and the address generator is connected, via two separate transmission lines, respectively to the defective data storing memory and the failure history storing memory, whereby the first address signal and the second address signal can be independently and separately supplied to the defective data storing unit and the failure history storing memory, respectively.

The address generator preferably comprises: an internal address generator which generates an internal address signal that specifies an address based on a cell configuration inside the memory; an address converting unit which converts the internal address signal to the input address signal; a first address output unit which outputs to the defective data storing memory a first address signal that is either the internal address signal or the input address signal; and a second address output unit which outputs to the failure history storing memory a second address signal that is either the internal address signal or the input address signal.

The address generator may further comprise: an address output unit which constantly supplies the input address signal to the memory.

Preferably, second address output unit 124 outputs the second address signal to the failure history storing memory in a manner corresponding to the input data signal and the control signal when the defective spot is detected.

Moreover, the first address output unit and the second address output unit may be multiplexers, so as to be able to select one among the internal address signal and the input address signal.

According to an other aspect of the present invention, a method for testing a memory, comprises steps of: generating an internal address signal specifying an address based on a cell configuration inside the memory; converting the internal address signal to an input address signal; supplying to the memory the thus converted input address signal and a input test signal including an input data signal that is to be input to a data pin of the memory; generating an expectation value data signal which is to be output, based on the input test signal, from the memory, as a response result from a normal memory device; detecting a defective spot of the memory by comparing the output data signal output from the memory and the expectation value data signal; and outputting to a defective data storing memory both a defective-indicating data indicating of existence of the defective spot in the memory and the internal address signal, and simultaneously outputting to a failure history storing memory both failure history data including the input data signal when the defective spot is detected, and the input address signal.

This summary of the invention does not necessarily describe all necessary features so that the invention may also be a sub-combination of these described features.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
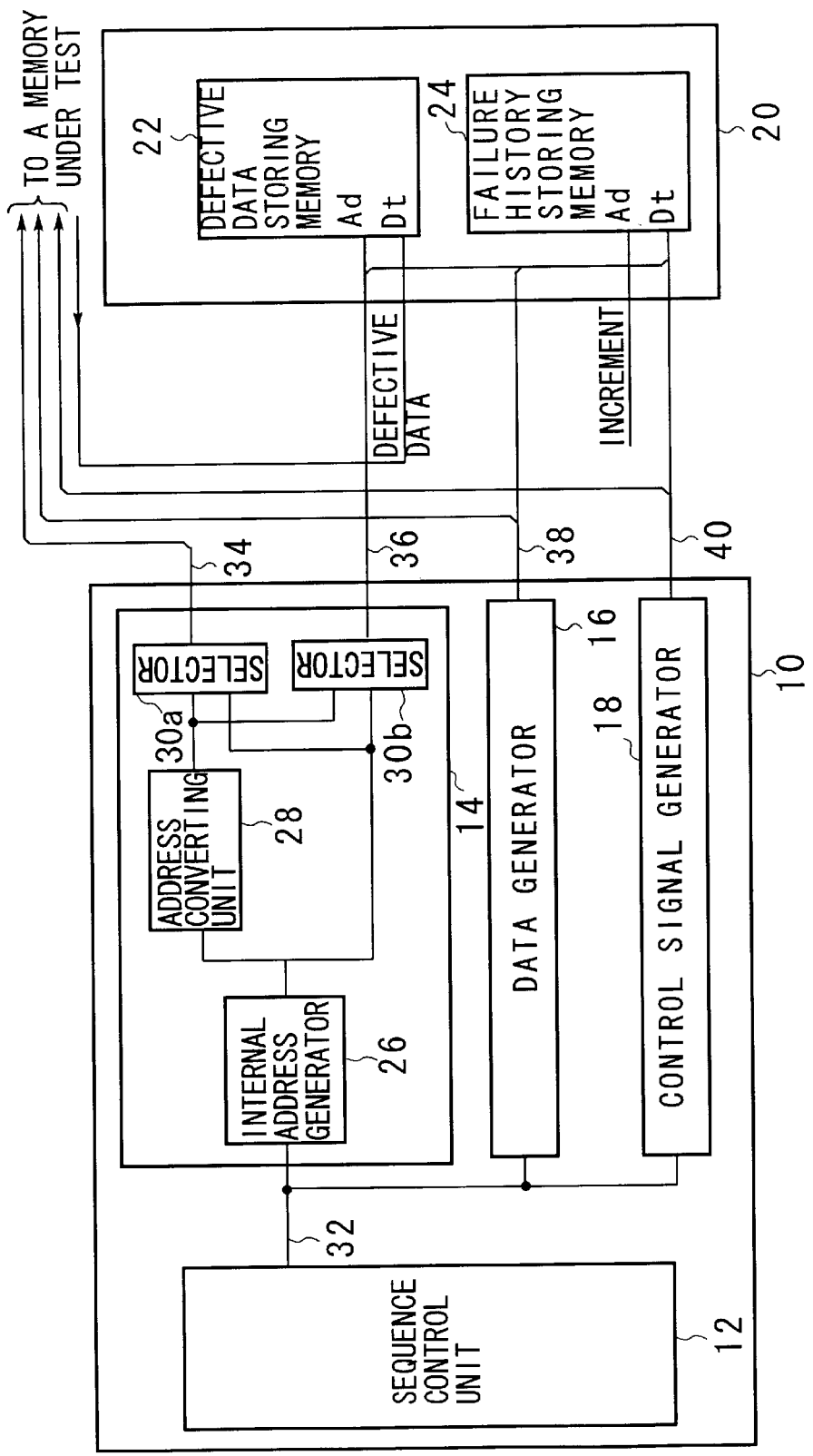
FIG. 1 shows how a pattern generator 10 is connected to a failure memory 20 in the conventional memory testing apparatus which tests a memory under test.
Figure 2:
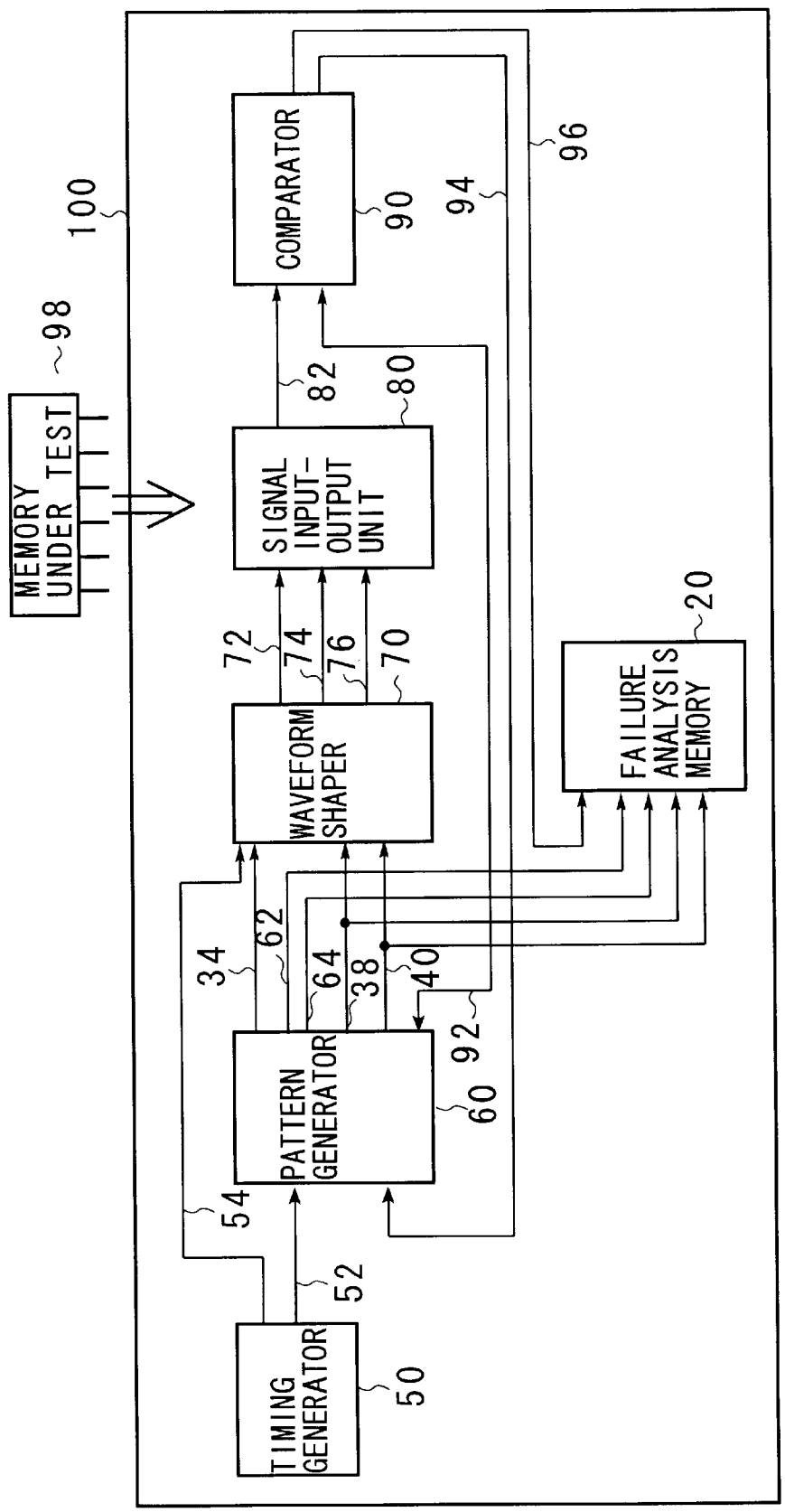
FIG. 2 is a block diagram of a memory testing apparatus 100 for testing a memory under test 98 according to the present embodiment.

FIG. 2 is a block diagram of a memory testing apparatus 100 for testing a memory under test 98, according to the present embodiment. The memory testing apparatus 100 comprises: a timing generator 50; a pattern generator 60; a waveform shaper 70; a signal input-output unit 80; a comparator 90; and a failure analysis memory 20.

The timing generator 50 outputs a reference clock signal 52 to the pattern generator 60. Based on the reference clock signal 52, the pattern generator 60 generates input test signals which include: an input address signal 34 supplied to an address pin of the memory under test 98, an input data signal 38 supplied to a data pin of the memory under test 98, and a control signal 40 supplied to a control pin of the memory under test 98. The control signal 40, for example, serves as a write request signal. The input test signals comprised of the input address signal 34, the input data signal 38 and the control signal 40 generated by the pattern generator 60 are supplied to the waveform shaper 70.

The timing generator 50 supplies a timing control signal 54 to the waveform shaper 70. Based on the timing control signal 54, the waveform shaper 70 shapes the input test signal so as to comply with the input characteristics of the memory under test 98. The waveform shaper 70 supplies to the signal input-output unit 80 the waveform-shaped input address signal 72, input data signal 74 and control signal 76.

The signal input-output unit 80 supplies the input test signal to the memory under test 98. The input address signal 72, the input data signal 74 and the control signal 76 are respectively input to the address pin, data pin and control pin of the memory under test 98. Data of the input data signal 74 is written to an internal cell specified by the input address signal 72.

After the input data signal 74 is written, the pattern generator 60 generates the control signal 40 and input address signal 34 which require reading-out of data. The control signal 40 and input address signal 34 thus generated, are shaped by the waveform shaper 70. The waveform-shaped control signal 76 and input address signal 72 are input from the signal input-output unit 80 to the control pin and address pin of the memory under test 98, respectively. The signal input-output unit 80 receives an output data signal, which is output (read out) from the memory under test 98, so as to be output to the comparator 90.

Moreover, based on the input test signal, the pattern generator 60 generates an expectation data signal 92 which is to be output, as a response result of a normal memory device, from the memory under test 98, so as to be output to the comparator 90. This expectation value data signal 92 has the same signal pattern as the input data signal 38 which is written to the memory under test 98.

The comparator 90 compares the output data signal 82 to the expectation value data signal 92. When the output data signal 82 coincides with the expectation value data signal 92 in the comparator 90, the memory under test 98 is judged to be normal, that is, non-defective. On the other hand, when the output data signal 82 does not coincide with the expectation value data signal 92, the memory under test 98 is judged as having at least one defective spot. The comparator 90 is comprised of an exclusive OR circuit, and when the value of the output data signal 82 differs from that of the expectation data signal 92, failure data 96 (i.e. "1") indicating there is a defective spot is output. Moreover, the comparator 90 supplies a judgment result 94 of the memory under test 92 to the pattern generator 60.

Upon receipt of the judgment result 94 indicating that a defective spot exists, the pattern generator 60 outputs to the failure analysis memory 20 the first address signal 62, second address signal 64, data signal 38 and control signal 40 acquired at the time of detecting the defective spot. Output as the first address signal 62, is either the internal address which specifies an address based on the cell configuration inside the memory under test 98 or the input address signal which is actually input to the address pin of the memory under test 98 so as to access the address. Similarly, as the second address signal 64, either the internal address or the input address signal is output. The first address 62 and the second address signal 64 are output independently to each other. Thus, the first address signal 62 maybe the internal address signal while the second address signal 64 may be the input address signal. Each signal input to the failure analysis memory 20 will be utilized for saving the failure and failure analysis at a later stage.

Figure 3:
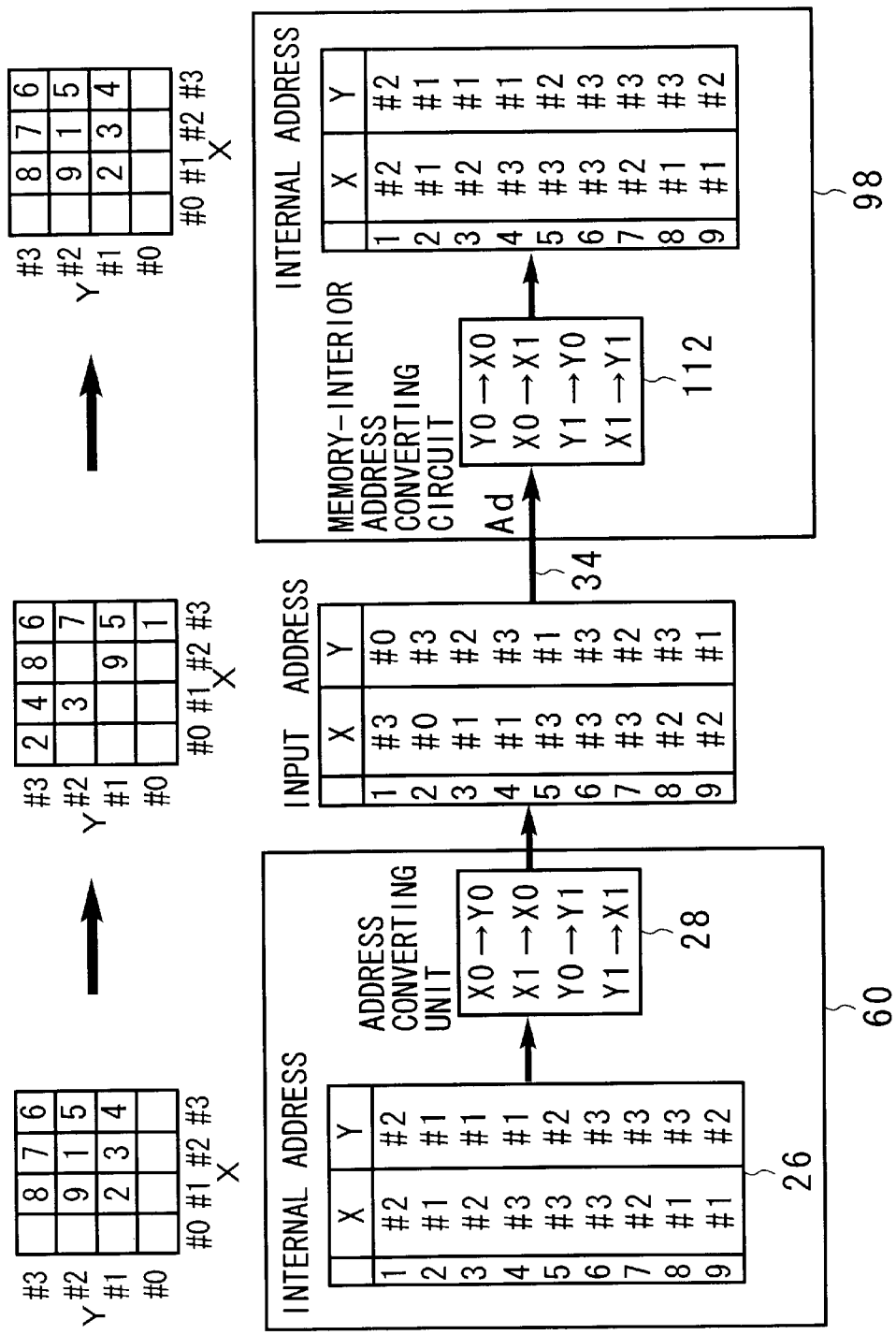
FIG. 3 illustrates a conversion process of the address signal supplied from the pattern generator 60 to the memory under test 98.

FIG. 3 illustrates a conversion process of the address signal supplied from the pattern generator 60 to the memory under test 98. In general, a memory cell is optimally configured in the memory devices. Namely, inside a memory device, wiring that connects the address pin and each cell is formed based on the physical requirement. Therefore, the address signal which is input to the address pin of the memory device is not necessarily accessed to the internal cell specified by the said address signal. For these reasons, the memory under test 98 usually contains a memory-interior address converting circuit 112 inside the memory under test 98. As described above, the memory-interior address converting circuit 112 is comprised of wirings which connect the address pin with the internal cell.

As an example for testing the memory under test 98, a cell interference test is carried out for examining the interference between cells. In the cell interference test, data needs to be written to an adjacent cell, so that the address signal that is input to the address pin must access said cell specified inside the cell. Therefore, particularly in this type of cell interference test, the input address corresponding to the internal address of the cell of the memory under test 98 needs to be supplied to the address pin of the memory under test 98.

An internal address generator 26 included in the pattern generator 60 generates an internal address signal which specifies an internal cell in the memory under test 98. The internal address signals are generated in the order of (#2, #2), (#1, #1), (#2, #1), (#3, #1), (#3, #2), (#3, #3), (#2, #3), (#1, #3) and (#1, #2). The internal address signal is converted to the input address signal which corresponds to the address pin of the memory under test 98. The address converting unit 28 determines a conversion mode so that it performs an inverse conversion of the memory-interior address converting circuit 112 of the memory under test 98.

For example, when the conversion mode shown in a clock of the address converting unit 28 is taken, (10, 10) is converted to (11, 00) for example. Namely, (#2, #2) is converted to (#3, #0). The input address signal 34 which is converted in the address converting unit 28 is input to the address pin of the memory under test 98.

The input address signal 34 that is input to the address pin is input to the memory-interior address converting unit 112, so as to be converted to the original internal address signal. As a result, the memory cell inside the memory under test 98 can be accessed in the order of the internal address generated in the internal address generator 26.

Figure 4:
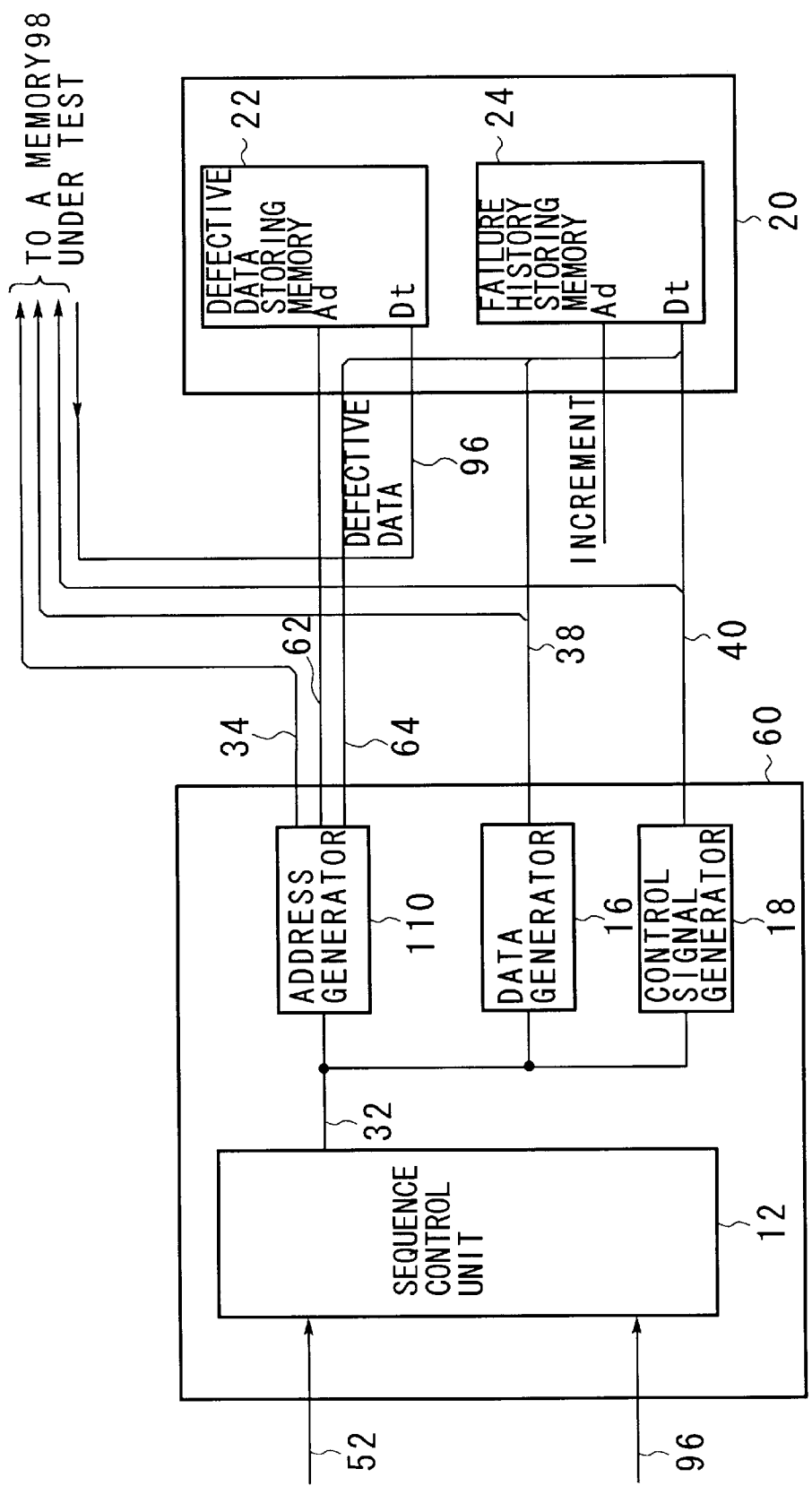
FIG. 4 is a signal connection diagram for the pattern generator 60 and the failure analysis memory 20 in the memory testing apparatus 100 according to the present embodiment.

FIG. 4 is a signal connection diagram for the pattern generator 60 and the failure analysis memory 20 in the memory testing apparatus 100 according to the present embodiment. The pattern generator 60 comprises a sequence control unit 12, an address generator 110, a data generator 16 and a control signal generator 18. Moreover, the failure analysis memory 20 comprises a defective data storing memory 22 and a failure history storing memory 24. The defective data storing memory 22 has the same capacity as that of the memory 98 under test.

The sequence control unit 12 generates a sequence control signal 32 which controls the sequence of the data generator 16 and the control signal generator 18.

As a result of the test, when there exists a defective spot in the memory under test 98, the pattern generator 60 supplies to the failure analysis memory 20 the data on the defective saving and/or failure analysis for a future use in analyzing a failure. The address generator 110 outputs to the failure analysis memory 20 a first address signal 62 and a second address signal 64 via two separate channels. As described with reference to FIG. 2, the first address 62 signal is either the internal address signal or the input address signal while the second address signal 64 is either the internal address signal or the input address signal. The first address signal 62 and the second address signal 64 are supplied to the failure analysis memory 20 in a mutually independent manner.

It is to be noted that the internal address signal usually represents a logical address which is one prior to the conversion, and the input address signal represents a physical address which is one after the conversion.

The address generator 110 supplies the first address signal 62 to the address pin of the defective data storing memory 22. The address generator 110 also supplies the second address signal to the data pin of the failure history storing memory 24. Moreover, the data generator 16 supplies to the data pin of the failure history storing memory 24 a data signal 38 acquired when the defective spot is detected. Similarly, the control signal generator 18 supplies to the data pin of the failure history storing memory 24 a control signal 40 acquired when the defective spot is detected. The defective data are supplied to the data pin of the defective data storing memory 22 while an increment signal is supplied to the address pin of the failure history storing memory 24.

As a result, in the defective data storing memory 22, the defective data 96 are written to an address which is specified by the first address signal 62 and which corresponds to the defective spot of the memory under test 98. Moreover, in the failure history storing memory 24, the failure history data such as the address signal 64, input data signal 38 and control signal 40 acquired at the time of testing when the defective spot is detected are written in the order that the defective spots are detected. The data stored in the defective data storing memory 22 and the failure history storing memory 24 are utilized for saving the defective as well as for the failure analysis of the memory under test at a later stage.

Notice that in the conventional address generator there is available a single-system signal transmission line to the failure analysis memory 20, thus the same address signal 36 can only be supplied to the defective data storing memory 22 and the failure history storing memory 24. In contrast thereto, since the address generator 110 according to the present embodiments has two-system signal transmission lines connected to the failure analysis memory 20, the address signals 62 and 64 can be independently and respectively supplied to the defective data storing memory 22 and the failure history storing memory 24. Therefore, even in the case where the internal address signal is supplied to the defective data storing memory 22 while the input address signal is supplied to the failure history storing memory 24, this requirement can be achieved by simply performing a single test instead two separate tests.

Namely, in the conventional practice, an address for use with the defective address storing memory 22 can not be selected individually and separately from an address for use with the failure history storing memory 24. In other words, since in the conventional memory testing apparatus a single address signal is connected from the pattern generator 60 to the failure analysis memory 20, the address for use with both the defective data storing memory 22 and the failure history storing memory 20 are either the logical address or the physical address at a time. Therefore, in the case where we wish to carry out the process of storing the defective address data with the logical address while the process of storing the failure history with the physical address, for example, the process of storing the defective address data has to be performed first using the logical address only and, next, a program is changed then the process of storing the failure history has to be performed using the physical address. Thus, two separate testings must be performed in the conventional practice in that case. In contrast thereto, in the present embodiments, the address output is so arranged that there are provided two separate transmission lines therefrom, namely there are provided a transmission line from the address generator for use with the defective data storing memory 22 alone and another transmission line from for use with the failure history storing memory 24 alone. Moreover, it is to be noted that the address output for use with the failure history storing memory 24 may be selected from as the physical address that is to be supplied to the memory under test 98 and as the logical address for use with the defective data storing memory.

Figure 5:
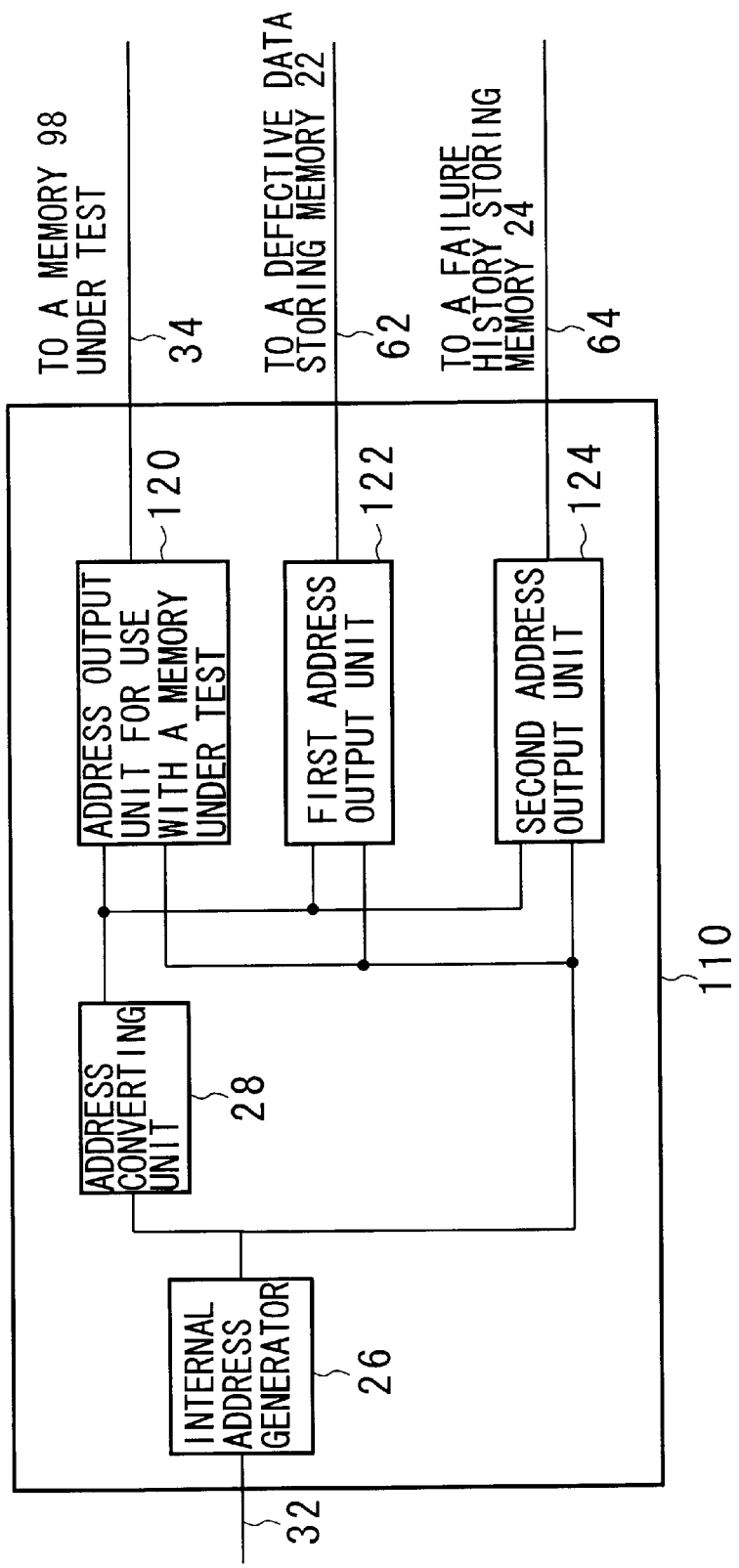
FIG. 5 is a block diagram showing an embodiment for the address generator 110.

FIG. 5 is a block diagram showing an embodiment for the address generator 110. The address generator 110 comprises an internal address generator 26, an address converting unit 28, an address output unit for use with a memory under test 120, a first address output unit 122 and a second address output unit 124.

The internal address generator 26 generates an address signal which specifies an address based on the cell configuration inside the memory under test 98. Moreover, the address converting unit 28 converts the internal address signal to the input address signal which is to be input to the address pin of the memory under test 98, based on the correspondence relationship between the cell configuration and the pin configuration of the address pin inside the memory under test 98. Both the internal address signal and the input address signal are supplied to the address output unit for use with the memory under test 120, the first address output unit 122 and the second address output unit 124, respectively. The respective address output unit 120, the first address output unit 122 and the second address output unit 124 maybe multiplexers, so as to be able to select one among two inputs.

The address output unit for use with the memory under test 120 constantly outputs the input address signal 34 which is to be fed to the memory under test 98. Thus, according to another embodiment, the address output unit for use with the memory under test 120 may not be provided, so that the output of the address converting unit 28 may be supplied directly to the memory under test 98.

The first address output unit 122 outputs to the defective data storing memory 22 the first address signal 62 which is either the internal address signal or the input address signal. Similarly, the second address output unit 124 outputs to the failure history storing memory 24 the second address signal 64 which is either the internal address signal or the input address signal. The first address output unit 122 and the second address output unit 124 can mutually and independently select a signal, moreover, can simultaneously output both the first address signal 62 and the second address signal 64. Referring to FIG. 4, it is desirable that the second address output unit 124 shall output the second address signal 64 to the failure history storing memory 24 in a manner corresponding to the input data signal 38 and the control signal 40 at the time when the defective spot is detected.

Figure 6:
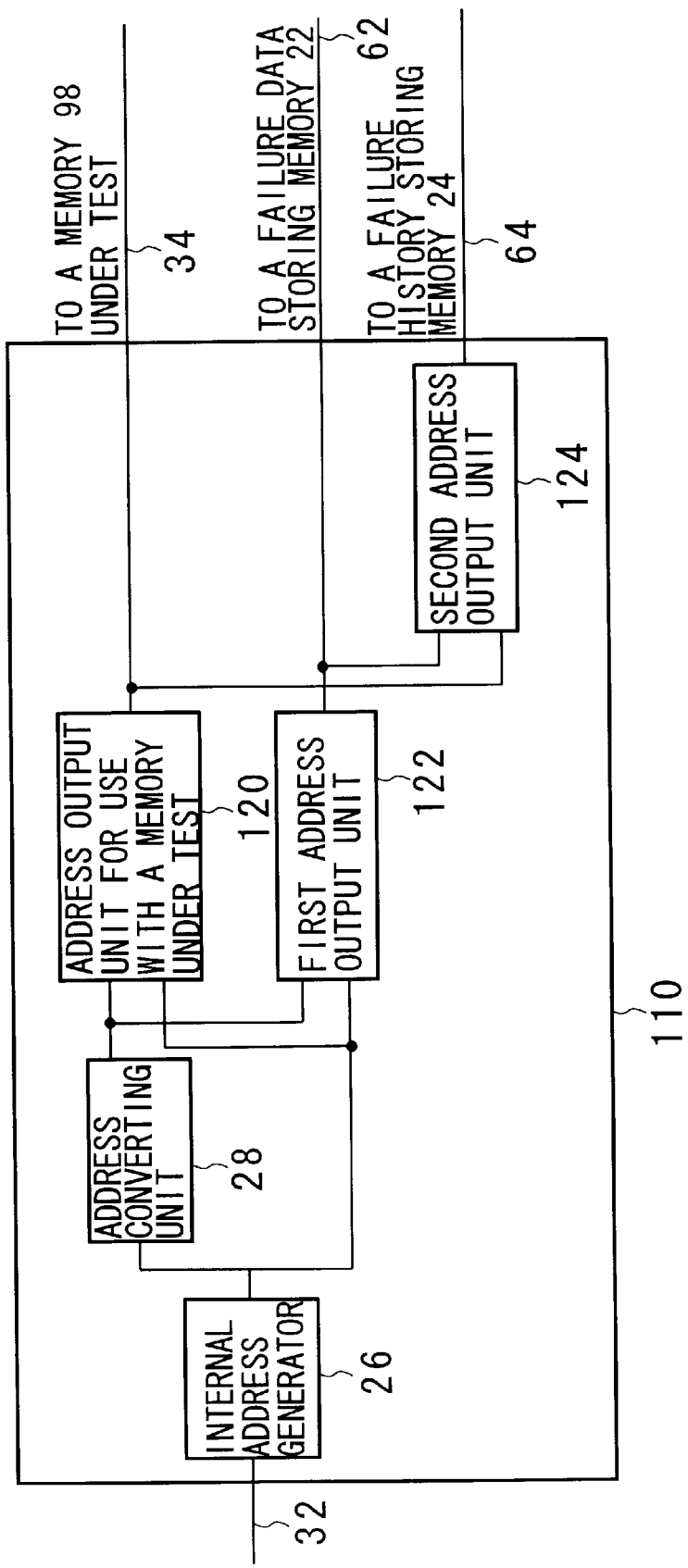
FIG. 6 is a block diagram of the address generator 110 according to another embodiment.

FIG. 6 is a block diagram of the address generator 110 according to another embodiment. The address generator 110 according to this present embodiment comprises an internal address generator 26, an address converting unit 28, an address output unit 120 for use with the memory under test, a first address output unit 122, and a second address output unit 124. The elements given the same reference numbering are the same as the structure and operation shown in FIG. 5.

According to the present embodiment shown in FIG. 6, an input of the second address output unit 124 is connected to both the address output unit 120 for use with the memory under test 120 and the first address output unit 122. When the address output unit for use with the memory under test 120 outputs an input address signal and the first address output unit 122 outputs an internal address signal, both the input address signal and the internal address signal are input to the second address output unit 124. The second address output unit 124 selects either he input address signal or the internal address signal, and then supplies the elected second address signal 64 to the failure history storing emory 24.

According to the above present embodiments, there are provided two separate address signal transmission lines between the pattern generator 60 and the failure analysis memory 20. Thus, time necessary for transmitting the address signal from the pattern generator 60 to the failure analysis memory 20 can be significantly reduced, so that the efficiency in testing the memory under test can be significantly improved. Moreover, the address signal for use with the failure analysis as well as for saving the defect can be efficiently supplied to the defective saving analysis memory in a short period of time.

Although the present invention has been described by way of exemplary embodiments, it should be understood that many changes and substitutions may be made by those skilled in the art without departing from the spirit and the scope of the present invention which is defined only by the appended claims.

What is claimed is:

1. A memory testing apparatus for testing a memory, comprising:
    a pattern generator which outputs:
        an input address signal supplied to an address pin of the memory,
        an input test signal, including an input data signal, supplied to a data pin of the memory, and
        an expectation value data signal which is an expectation value data signal that is to be output, based on the input test signal, from the memory , as a response result from a normal memory device;
    a signal input-output unit which supplies the input test signal to the memory and receives an output data signal from the memory;
    a comparator which compares the output data signal with the expectation value data and outputs a defect-indicating data indicative of existence of a defective spot in the memory;
    a defective data storing memory which writes the defect-indicating data output from said comparator, to an address corresponding to the defective spot of the memory; and
    a failure history storing memory which stores failure history data including the input data signal when the defective spot is detected,
    wherein said pattern generator includes:
        an internal address generator which generates an internal address signal specifying an address based on a cell configuration inside the memory;
        an address converting unit which, based on a correspondence relationship between the cell configuration inside the memory and a pin configuration of the address pin, converts the internal address to the input address signal that is to be input to the address pin;
        a first address output unit which outputs to said defective data storing memory either the internal address signal or the input address signal; and
        a second address output unit which outputs to said failure history storing memory either the internal address signal or the input address signal.

2. Apparatus of claim 1, wherein said second address output unit outputs to said failure history storing memory either the internal address signal or the input address signal in a manner corresponding to the input data signal.

3. Apparatus of claim 1, wherein the internal address signal represents a logical address and the input address signal represents a physical address.

4. Apparatus of claim 1, wherein an input of said second address output unit is connected to said first address output unit.

5. A memory testing apparatus for testing a memory, comprising:
    a pattern generator which outputs:
        an input address signal supplied to an address pin of the memory,
        an input test signal, including an input data signal, supplied to a data pin of the memory, and
        an expectation value data signal which is an expectation value data signal that is to be output, based on the input test signal, from the memory, as a response result from a normal memory device;
    a signal input-output unit which supplies the input test signal to the memory and receives an output data signal from the memory;
    a comparator which compares the output data signal with the expectation value data and outputs a defect-indicating data indicative of existence of a defective spot in the memory;
    a defective data storing memory which writes the defect-indicating data output from said comparator, to an address corresponding to the defective spot of the memory; and
    a failure history storing memory which stores failure history data including the input data signal when the defective spot is detected, wherein said pattern generator includes:

a sequence control unit which generates a sequence control signal that controls an address generator, a data generator and a control signal generator connected thereto, said address generator outputting a first address signal and a second address signal therefrom, and said address generator being connected, via two separate transmission lines, respectively to said defective data storing memory and said failure history storing memory, whereby the first address signal and the second address signal can be independently and separately supplied to said defective data storing unit and said failure history storing memory, respectively.

6. Apparatus of claim 5, wherein said address generator comprises:

an internal address generator which generates an internal address signal that specifies an address based on a cell configuration inside the memory;

an address converting unit which converts the internal address signal to the input address signal;

a first address output unit which outputs to said defective data storing memory a first address signal that is either the internal address signal or the input address signal; and a second address output unit which outputs to said failure history storing memory a second address signal that is either the internal address signal or the input address signal.

7. Apparatus of claim 6, said address generator further comprising:

an address output unit which constantly supplies the input address signal to the memory.

8. Apparatus of claim 6, wherein the internal address signal represents a logical address and the input address signal represents a physical address.

9. Apparatus of claim 6, wherein said second address output unit outputs the second address signal to the failure history storing memory in a manner corresponding to the input data signal and the control signal when the defective spot is detected.

10. Apparatus of claim 6, wherein said first address output unit and said second address output unit are multiplexers, so as to be able to select one among the internal address signal and the input address signal.

11. A method for testing a memory, comprising:

generating an internal address signal specifying an address based on a cell configuration inside the memory;

converting the internal address signal to an input address signal;

supplying to the memory the converted input address signal and a input test signal including an input data signal that is to be input to a data pin of the memory;

generating an expectation value data signal which is to be output, based on the input test signal, from the memory, as a response result from a normal memory device;

detecting a defective spot of the memory by comparing the output data signal output from the memory and the expectation value data signal; and outputting to a defective data storing memory both a defective-indicating data indicating of existence of the defective spot in the memory and the internal address signal, and simultaneously outputting to a failure history storing memory both failure history data including the input data signal when the defective spot is detected, and the input address signal.

* * * * *